United States Patent [19]

McCorkle

[11] Patent Number: 5,160,896
[45] Date of Patent: Nov. 3, 1992

[54] CLASS D AMPLIFIER

[75] Inventor: David P. McCorkle, Carmel, Ind.

[73] Assignee: Harman International Industries, Incorporated, Northridge, Calif.

[21] Appl. No.: 837,166

[22] Filed: Feb. 18, 1992

[51] Int. Cl.$^5$ .............................................. H03F 3/38
[52] U.S. Cl. ..................................... 330/251; 307/314; 330/207 A
[58] Field of Search ...................... 307/314; 330/8, 10, 330/207 A, 251, 262, 264, 269, 277; 381/120

[56] References Cited

U.S. PATENT DOCUMENTS

| | | | |
|---|---|---|---|
| 2,915,588 | 12/1959 | Bose | 179/1 |
| 3,038,964 | 6/1962 | Bose | 179/1 |
| 3,294,981 | 12/1966 | Bose | 307/88.5 |
| 4,456,872 | 6/1984 | Foreschle | 323/286 |
| 4,531,096 | 7/1985 | Yokayama | 330/251 X |
| 4,602,166 | 7/1986 | Smith | 307/314 |
| 4,649,565 | 3/1987 | Kaizer et al. | 330/251 X |

*Primary Examiner*—Steven Mottola
*Attorney, Agent, or Firm*—Barnes & Thornburg

[57] ABSTRACT

A hysteresis-type pulse width modulator for a class D audio amplifier converts an input voltage into a pulse width modulated waveform. The width of the pulses is related to the input voltage amplitude. The modulator comprises a window comparator, a supply voltage source having a pair of terminals across which a supply voltage is provided, and a hysteresis voltage source having a pair of terminals across which a hysteresis voltage is provided. The hysteresis voltage source comprises a multiplier, a comparator for adding the supply voltage and input voltage to generate a sum voltage, and a comparator for subtracting the input voltage from the supply voltage to generate a difference voltage. The audio amplifier output stage comprises first and second solid state devices, each having a controlled current conducting path comprising first and second terminals and a controlling current conducting path comprising at least a third terminal. The output stage also includes an uncontrolled current conducting path in antiparallel relation with each of the devices' controlled current conducting paths. A saturable reactor is positioned in series with the uncontrolled current conducting path to limit current flow therethrough during the switching of current flow from the controlled current conducting path of one of the devices to the uncontrolled current conducting path occasioned by operation of the amplifier.

23 Claims, 4 Drawing Sheets

CLASS D AMPLIFIER

This invention relates to improved class D amplifiers. It is disclosed in the context of a class D audio amplifier, but is believed to have applicability to class D amplifiers for other applications as well.

In class D audio amplifier design, hysteresis pulse width modulators have the inherent advantages of low distortion, high power supply rejection, and automatic compensation for any switching waveform anomalies caused by non-ideal components. However, the operating frequency of circuits employing class D technology varies dramatically with input signal voltage. The operating frequency for the prior art circuit of FIG. 1 can be shown to be:

$$2\pi f_{pwm} = \frac{(V_s - V_i)(V_s + V_i)}{2 C R V_s V_h} \quad (1)$$

Where $\pm V_s$=supply voltage; $V_i$=input signal voltage; $V_h$=hysteresis voltage; C=capacitance, in farads, of the integrating capacitor; and, R=resistance, in ohms, of the feedback and input resistors. For purposes of this discussion, the resistances of the input and feedback resistors are considered equal (unity gain). However, relevant principles hold with any designed gain.

In the operation of the FIG. 1 circuit, all terms on the right hand side of equation (1) are constants with the exception of $V_i$, the audio input signal voltage. As the input signal voltage instantaneously approaches either supply voltage ($\pm V_s$, one or the other of the terms in the numerator of equation (1) approaches zero. The operating frequency drops accordingly. This drop in frequency can permit the pulse width modulator's own lowered switching frequency to appear as an audible artifact in the output signal.

Class D amplifiers have many advantages such as small size, light weight, low cost, high efficiency, and reduced heat generation. However, undesirable radio frequency emissions can occur in the operation of such amplifiers. The emissions are a product of the rapid switching of substantial currents and voltages which are inherent in class D operation. These emissions can interfere with radio communication.

According to one aspect of the invention, a push-pull audio amplifier output stage comprises first and second solid state devices. Each device has a controlled current conducting path comprising first and second terminals and a controlling current conducting path comprising at least a third terminal. The output stage further comprises an uncontrolled current conducting path in antiparallel relation with one of said devices' controlled current conducting paths. A saturable reactor in series with the uncontrolled current conducting path limits current flow therethrough during the switching of current flow from the controlled current conducting path of the one of the devices to the uncontrolled current conducting path in antiparallel relation therewith occasioned by operation of the amplifier.

According to an illustrative embodiment of this aspect of the invention, uncontrolled current conducting paths are provided in antiparallel relation with both of the devices' controlled current conducting paths, and saturable reactors are provided in series with both of the uncontrolled current conducting paths to limit current flow therethrough during the switching of current flow from both of the controlled current conducting paths to both of the uncontrolled current conducting paths occasioned by operation of the amplifier.

Illustratively according to this aspect, the devices are first and second field effect transistors (FETs), respectively. The first and second terminals are drain and source terminals of the FETs. The third terminals are gate terminals of the FETs. The source terminal of the first FET is coupled to the drain terminal of the second FET and to a load of the audio amplifier.

Further illustratively according to this aspect, the uncontrolled current conducting paths comprise first and second diodes. The anodes of the first and second diodes are coupled to the sources of the first and second FETs, respectively, and the cathodes of the first and second diodes are coupled to the drains of the first and second FETs, respectively.

Additionally illustratively according to this aspect, the first and second diodes are first and second body diodes incorporated into the bodies of the first and second FETs, respectively, during manufacture of the first and second FETs.

Illustratively according to this aspect of the invention, an RC circuit is situated in parallel with each of the diodes.

Illustratively, the audio amplifier is a class D audio amplifier.

Further illustratively according to this aspect of the invention, the saturable reactor comprises a bead having a passageway therethrough for receiving a conductor which is in series with the uncontrolled current conducting path.

According to another aspect of the invention, a hysteresis-type pulse width modulator converts an input voltage into a pulse width modulated waveform, the width of the pulses of which is related to the input voltage amplitude. The modulator comprises a window comparator, a supply voltage source having a pair of terminals across which a supply voltage is provided, and a hysteresis voltage source having a pair of terminals across which a hysteresis voltage is provided. The hysteresis voltage source comprises a multiplier, a comparator for adding the supply voltage and input voltage to generate a sum voltage, and a comparator for subtracting the input voltage from the supply voltage to generate a difference voltage. The input voltage is provided to the sum voltage generating comparator and difference voltage generating comparator. The supply voltage source is coupled to the sum voltage generating comparator and difference voltage generating comparator. The sum voltage generating comparator and difference voltage generating comparator are coupled to the multiplier. The multiplier is coupled to the window comparator.

According to an illustrative embodiment of this aspect of the invention, the hysteresis-type pulse width modulator comprises an integrator, the window comparator, the hysteresis voltage source, and a flip-flop. The input voltage is coupled to the integrator, the integrator to the window comparator, the window comparator to the flip-flop, and the hysteresis voltage source to the window comparator.

Further illustratively according to this aspect of the invention, the window comparator comprises first and second comparators, each having non-inverting and inverting terminals. The integrator is coupled to the window comparator by coupling an output terminal of the integrator to a non-inverting input terminal of the first comparator and to an inverting input terminal of the second comparator. The hysteresis voltage source is coupled to the window comparator by coupling a first of the pair of terminals of the hysteresis voltage source to the inverting input terminal of the first comparator and a second of the pair of terminals of the hysteresis voltage source to the non-inverting input terminal of the second comparator.

The invention may best be understood by referring to the following descriptions and accompanying drawings which illustrate the invention. In the drawings.

Figure 1:
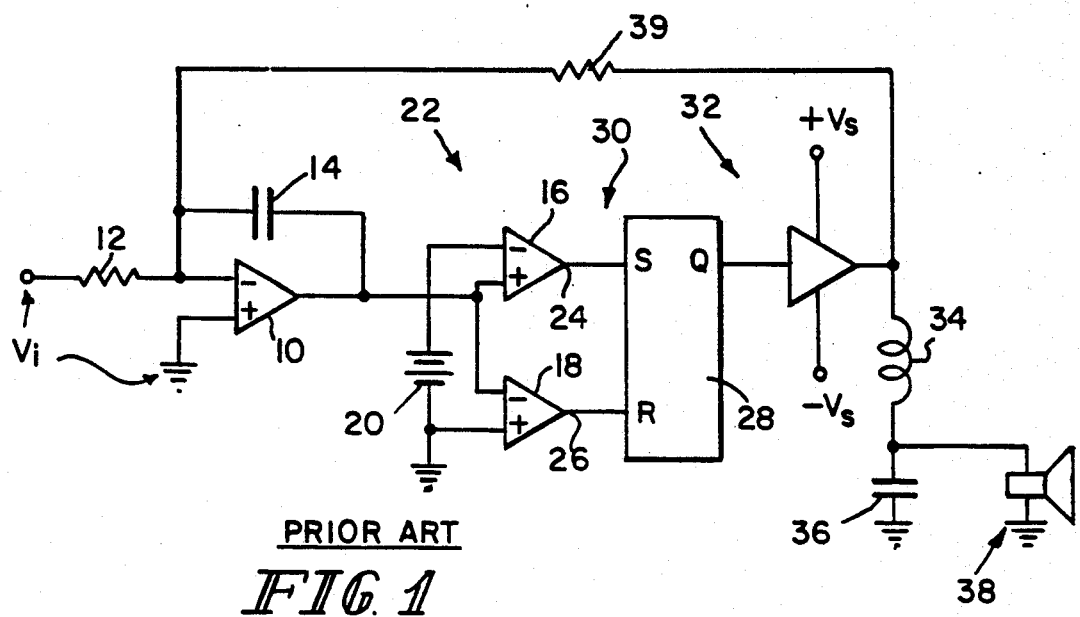
FIG. 1 illustrates a partly block and partly schematic diagram of a prior art hysteresis pulse width modulator equipped class D amplifier.

In FIG. 1, a difference amplifier 10, which illustratively is one-half of a National Semiconductor LM833, is coupled in integrator amplifier configuration to receive at its inverting (−) input terminal the input voltage signal $V_i$ through an input resistor 12. The non-inverting input terminal (+) of difference amplifier 10 is coupled to ground. An integrating capacitor 14 is coupled across the output terminal and − input terminal of amplifier 10. The output terminal of amplifier 10 is coupled to the + input terminal and − input terminal, respectively, of two difference amplifiers 16 and 18. The − input terminal of amplifier 16 is coupled to one terminal of a hysteresis voltage source 20 (illustrated as a battery) which provides a constant output voltage $V_h$. The other terminal of source 20 is coupled to the + input terminal of amplifier 18, and to ground. Difference amplifiers 16, 18 illustratively are each one-half of a National Semiconductor LM319. The coupling of difference amplifiers 16, 18 in this configuration constitutes a window comparator 22, the output terminals 24, 26 of which provide positive-going pulses at the S and R input terminals, respectively, of an SR flip-flop 28, depending upon whether the output signal from amplifier 10 is above $V_h$ or below ground, respectively. The Q output terminal of flip-flop 28 provides the modulated width pulses of the pulse width modulator 30 of FIG. 1. Flip-flop 28 illustratively is half of an RCA CD4011 quad NAND gate. In a class D audio amplifier these signals are then supplied to a basic, or power, amplifier 32, the output of which is supplied through a low pass filter including an inductor 34 in series and a capacitor 36 in parallel with a primarily resistive load 38, which illustratively is the voice coil of a moving coil loudspeaker. Feedback customarily is provided from an output terminal of power amplifier 32 to the − input terminal of amplifier 10 through a feedback resistor 39. The deficiency of this circuit is an previously discussed. The pulse width modulator 30's own reduced operating frequency $f_{pwm}$ can pass though the low pass filter 34, 36 and appear in the audio output of transducer 38.

Figure 2:
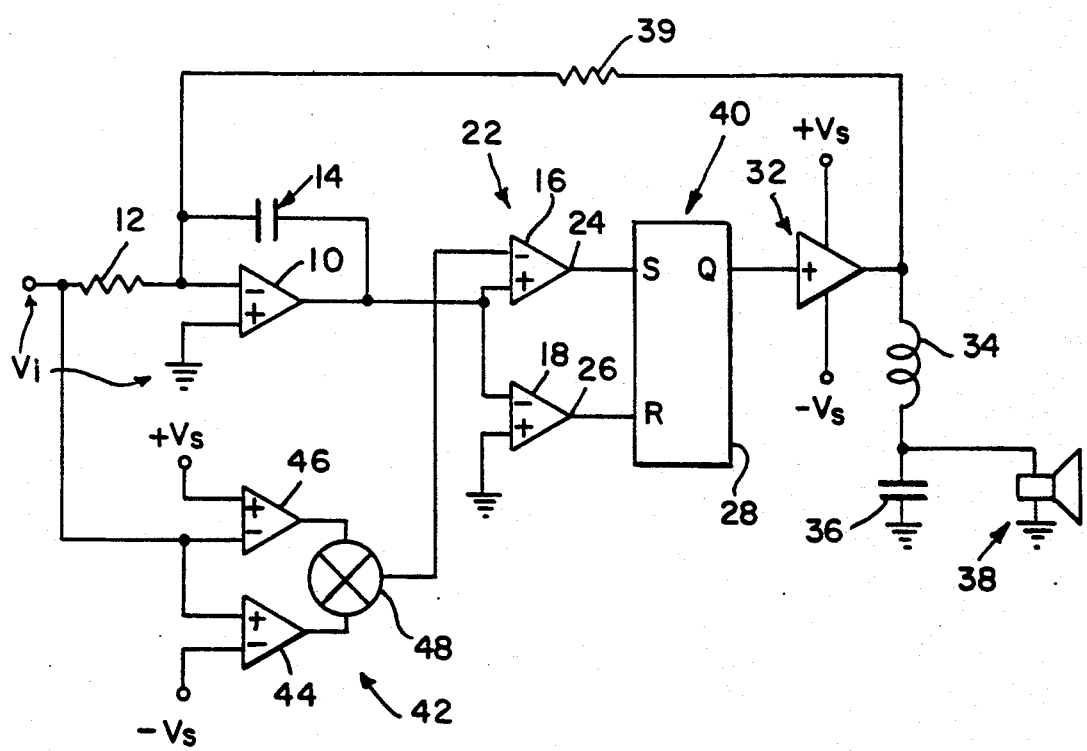
FIG. 2 illustrates a partly block and partly schematic diagram of a hysteresis pulse width modulator equipped class D amplifier according to an aspect of the invention.

In the circuit of FIG. 2, the hysteresis voltage, $V_h$, is made to vary in a compensatory manner with $V_i$ so that the pulse width modulator 30's operating frequency $f_{pwm}$ remains constant throughout the range of input voltage $V_i$. As FIG. 2 illustrates, an analog multiplier is used to provide a varying hysteresis voltage, $V_h'$, according to the following relationship:

$$V_h' = K^2(V_s - V_i)(V_s + V_i) \qquad (2)$$

where K is a constant. Inputs to the multiplier are $K(V_s - V_i)$ and $K(V_s + V_i)$ which are readily available. Substituting $V_h'$ in equation (1) gives the operating frequency $f_{pwm}$ the circuit in FIG. 2 as follows:

$$2\pi f_{pwm} = \frac{(V_s - V_i)(V_s + V_i)}{2 C R V_s K^2 (V_s - V_i)(V_s + V_i)} = \frac{1}{2 C R V_s K^2} \qquad (3)$$

It will be appreciated that all terms in the final form of equation (3) are constants. Thus, $f_{pwm}$ is a constant, independent of $V_i$.

In the improved class D audio amplifier of FIG. 2, those components which perform the same or similar functions to components illustrated in FIG. 1 are identified by the same reference numbers. A hysteresis voltage ($V_h'$) supply 42 includes first 44 and second 46 difference amplifiers and a multiplier 48. The input voltage $V_i$ is coupled to the + input terminal of the first difference amplifier 44 and to the − input terminal of the second difference amplifier 46. The − input terminal of first difference amplifier 44 is coupled the $-V_s$ terminal. The + input terminal of second difference amplifier 46 is coupled to the $+V_s$ terminal. The signals at the output terminals of difference amplifiers 44, 46 are thus $K(V_s + V_i)$ and $K(V_s - V_i)$, respectively, where K is a constant, the gain of amplifiers 44, 46. These signals are coupled to two input terminals of multiplier 48 to provide the $K^2(V_s - V_i)(V_s + V_i)$ or $V_h'$ hysteresis voltage signal required by equation (3) to the window comparator 22. In the embodiment illustrated in FIG. 2, the operating frequency $f_{pwm}$ of the pulse width modulator 40 has thus been rendered a constant, insensitive to the input voltage $V_i$. Amplifiers 44, 46 and multiplier 48 illustratively are collectively realized by a ROHM BA6110 operational transconductance amplifier.

Figure 3:
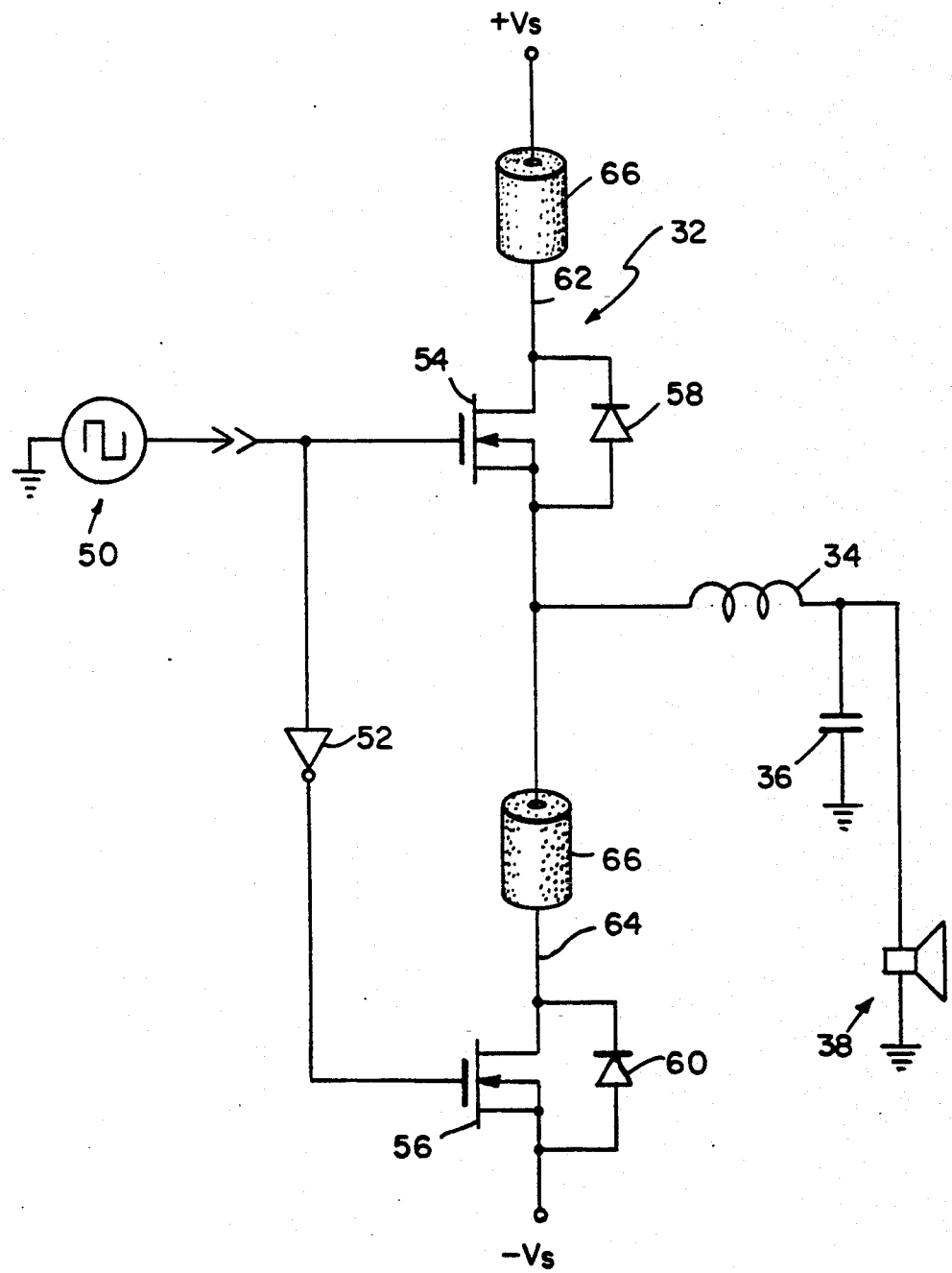
FIG. 3 illustrates a partly block and partly schematic diagram of a class D amplifier driver and output stage according to an aspect of the invention.

Referring now to FIG. 3, class D amplifiers typically employ push-pull output stages. Each FET in a push-pull configuration of the illustrated type is actually a combination of an FET switch and a diode coupled in antiparallel relation. During switching, the switch which is closing is often trying to impress a reverse voltage across a forward-biased diode opposite the switch. Stored charge in the diode momentarily causes the diode to look like a short circuit, supporting a very large reverse "shoot-through" current until the charge is swept from the diode. When the charge is dissipated, the large current "snaps off" very quickly, transmitting radio frequency energy. This energy is a primary cause of undesirable radio frequency interference (RFI) which attends the operation of such circuits.

To alleviate this problem, the class D amplifier of FIG. 3 employs an ultra high permeability saturable reactor bead, such as the Toshiba Amobead TM, on each switching MOSFET's drain lead. This places a saturable reactor in series with each switch/diode combination. In operation, during most of the switching cycle the ultra high permeability saturable reactors either are exposed to zero current or are in saturation and thus are not effectively in circuit. However, as either of the diodes goes from forward conduction, through zero current, and toward reverse biased, its series ultra high permeability saturable reactor comes out of saturation and momentarily provides a sufficient impedance in the path of would-be shoot through current to permit the diode's stored charge to be dissipated under lower current conditions. RFI is reduced dramatically. The addition of a small RC snubber further damps any remaining ringing tendencies.

By substantially reducing the generation of RFI-producing energy, this technique provides excellent RFI performance without shielded metal enclosures and feedthrough capacitors which previously have been used in class D audio amplifiers.

Turning now to FIG. 3, a basic amplifier 32 according to the present invention receives appropriately preamplified and otherwise processed signals from a logic drive source 50 which includes SR flip-flop 28 of FIGS. 1-2. The driver stage of amplifier 32 includes a final driver inverting amplifier 52 and a pair of output MOSFET switches 54, 56. Switches 54, 56 illustratively are Motorola MTP 50N06E MOSFETs. Switches 54, 56 are coupled in push pull configuration, with the inverting amplifier 52 inverting the signal which is coupled to the gate of switch 54 and providing this inverted drive signal to the gate of switch 56. Each switch 54, 56 is provided with a body diode 58, 60, respectively. Diodes 58, 60 are formed on the material from which switches 54, 56 are fabricated at the time of fabrication of the switches 54, 56 so that devices 54, 58 are in the same package and devices 56, 60 are in the same package and there are no external leads between devices 54, 58 or between devices 56, 60. The drain lead of MOSFET 54 and cathode of diode 58 are coupled by a suitable conductor 62 to the $+V_s$ supply terminal. The source lead of MOSFET 54 and anode of diode 58 are coupled through the series inductor 34 to the parallel combination of capacitor 36 and load 38. The source lead of MOSFET 54 and anode of diode 58 are also coupled to the drain lead of MOSFET 56 and cathode of diode 60 by a suitable conductor 64. The source lead of MOSFET 56 and anode of diode 60 are coupled to the $-V_s$ supply terminal. A high magnetic permeability bead 66 is placed on each of conductors 62, 64. During switching of MOSFETs 54, 56, as the polarities of the voltages across diodes 58, 60 reverse and the carriers begin to be swept out of the diodes 58, 60 as a result of this reversal, the tendency of the currents in diodes 58, 60 to surge uncontrolled in conductors 62, 64 is buffered by the saturable reactors 66. Since the reactors 66 saturate at relatively low current flows, the only times they affect the currents in conductors 62, 64 is during this reversal of the direction of current flow in conductors 62, 64. The rest of the time, that is, during periods of high current flow or no current flow in conductors 62, 64, saturable reactors 66 are invisible to the circuit of FIG. 3.

Figure 4:
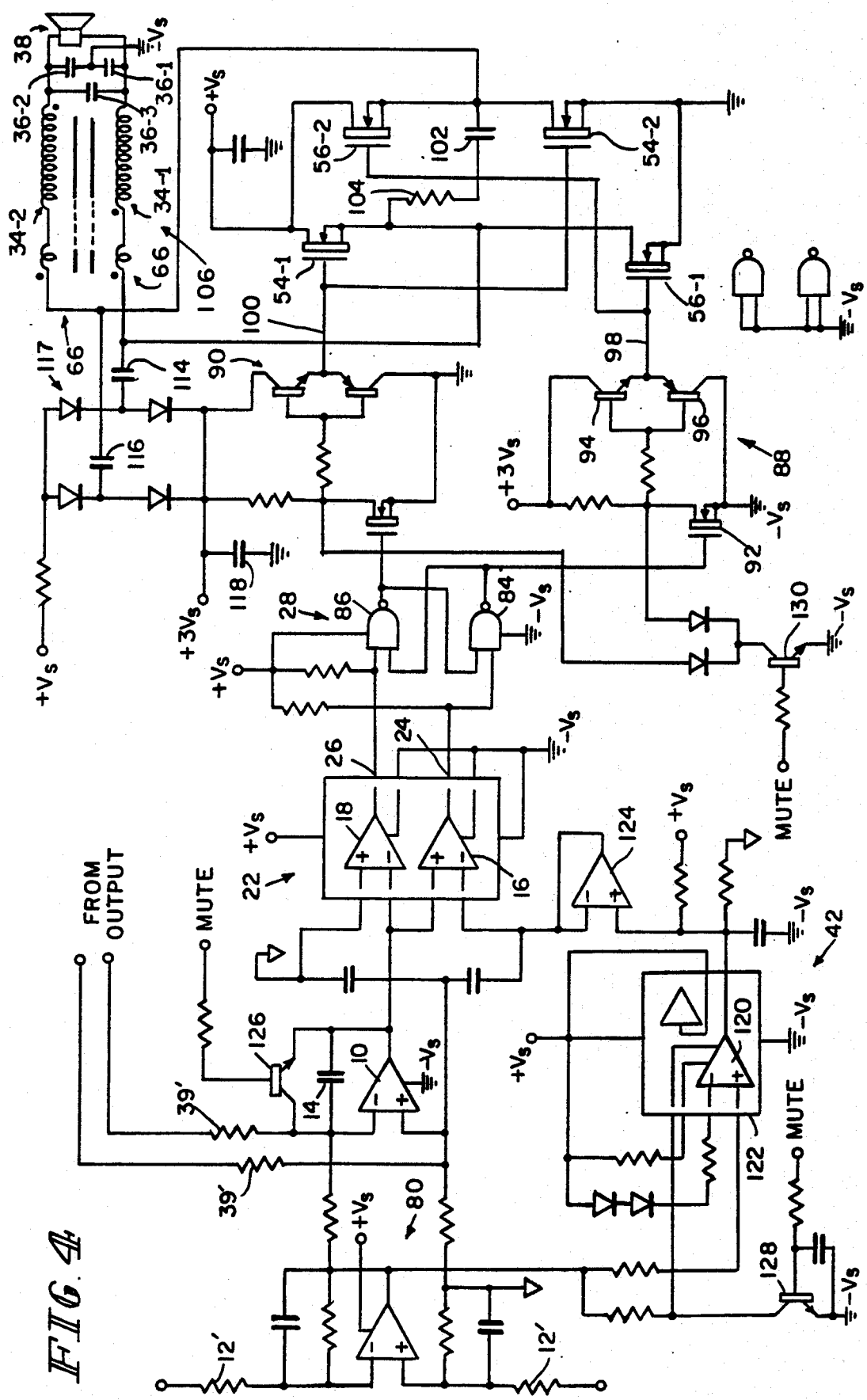
FIG. 4 illustrates a more detailed block and schematic diagram of part of an embodiment of the invention; and, FIG. 5 illustrates a more detailed block and schematic diagram of part of an embodiment of the invention.

Turning now to the more detailed schematic diagram of FIG. 4, the various illustrated pin numbers on the illustrated integrated circuits and devices refer to the specific integrated circuits and devices which have already been identified or will be identified herein. However, that does not constitute a representation, nor should any such representation be inferred, that there are no integrated circuits or devices other than those identified herein that will perform the functions performed by the identified integrated circuits and devices.

Common mode noise rejection in the input signal $V_i$ is achieved by an input difference amplifier 80 which illustratively is one half of a National Semiconductor LM833. $V_i$ is coupled across the + and − input terminals of difference amplifier 80. Identical 10K input resistors 12' are provided in series between the $V_i$ terminals and the respective + and − input terminals of amplifier 80. A feedback network including a parallel 22.1K resistor and a 47 pF capacitor is coupled between the output terminal of amplifier 80 and its − input terminal. An identical parallel RC network is coupled between the + input terminal of amplifier 80 and the signal common.

The output terminal of amplifier 80 and the signal common are coupled through identical 3.65K resistors to the − and + input terminals, respectively, of integrating difference amplifier 10. As previously noted, amplifier 10 illustratively is also half of an LM833 and illustratively is the other half of the same LM833 of which amplifier 80 is half. Consequently, $+V_s$ is illustrated connected to pin 8 of amplifier 80 and $-V_s$, which in the illustrated embodiment is the chassis voltage of the circuit, is illustrated connected to pin 4 of amplifier 10. The remaining power supply connections to these amplifiers are made on the integrated circuit chip on which they are realized. A 0.0033 $\mu$F integrating capacitor 14 is coupled between the output terminal of amplifier 10 and its − input terminal. The + input terminal of amplifier 10 is coupled through a 0.0015 $\mu$F capacitor to the − input terminal of difference amplifier 16, and through a 0.0015 $\mu$F capacitor to the circuit common. The output terminal of amplifier 10 is coupled to the + input terminal of difference amplifier 16 and to the − input terminal of difference amplifier 18. The + input terminal of amplifier 18 is coupled to the circuit common. Again, difference amplifiers 16, 18 are configured as a window comparator 22, and are realized on a National Semiconductor LM319 integrated circuit whose power supply terminals, pins 11 on the one hand and 3, 6 and 8 on the other, are coupled across the $+V_s$ and $-V_s$ (chassis) supply terminals.

The output terminals 24 and 26, respectively, of amplifiers 16, 18 are coupled to the S and R input terminals, respectively, of SR flip flop 28. Flip flop 28 is realized by two, 84, 86, of the two-input NAND gates of an RCA CD4011B quad, two-input NAND gate integrated circuit. 3K pull up resistors couple the S and R input terminals, pins 6 and 1, respectively, of flip flop 28 to switched $+V_s$. Pin 14 of flip flop 28 is also coupled to switched $+V_s$. Pin 7 of flip flop 28 is coupled to $-V_s$ (chassis). The output terminal of NAND gate 84 is coupled to the remaining input terminal of NAND gate 86 and the output terminal of NAND gate 86 is coupled to the remaining input terminal of NAND gate 84. Both input terminals of each of the two remaining NAND gates on the CD4011B are coupled to $-V_s$ and their output terminals are left open.

The drive for the output FETs is provided by two identical output driver circuits 88, 90, only one of which will be described in further detail here. The Q output, pin 4, of flip flop 28 is coupled to the gate electrode of an FET 92, which illustratively is a type 2N7000 FET. The source of FET 92 is coupled to $-V_s$ and its drain is coupled through a 1K resistor to $+3V_s$ which is generated as will be described hereinafter. The drain of FET 92 is also coupled through an 82 $\Omega$ resistor to the joined bases of complementary NPN and PNP transistors 94, 96 which illustratively are types 2N4401 and 2N4403 transistors, respectively. The collector of transistor 94 is coupled to $+3V_s$. The collector of transistor 96 is coupled to $-V_s$. Their emitters are joined and form the output terminal 98 of driver circuit 88. The corresponding output terminal of driver circuit 90 is identified by the reference number 100.

Each output transistor 54, 56 and its associated flyback diode 58, 60, respectively, in the embodiment of FIG. 3 are realized in the embodiment of FIG. 4 by a pair of FETs 54-1, 54-2; 56-1, 56-2, respectively. As previously noted, the flyback diodes are incorporated into the FETs during the manufacture of the FETs. FETs 54-1 and 54-2 serve to provide a pathway for the charging of a 0.01 μF capacitor 102 in a first sense (source of FET 54-1 going more positive with respect to drain of FET 54-2) between the $+V_s$ and $-V_s$ terminals. FETs 56-1 and 56-2 serve to provide a pathway for discharging capacitor 102 in the first sense or charging it in a second, opposite sense (source of FET 56-2 going more positive with respect to drain of FET 56-1) between the $+V_s$ and $-V_s$ terminals. The drains of FETs 54-1 and 56-2 are coupled to $+V_s$. The sources of FETs 54-2 and 56-1 are coupled to $-V_s$. The source and drain, respectively, of FETs 54-1 and 56-1 are coupled through capacitor 102 and a series 1Ω ring damping resistor 104 to the drain and source, respectively, of FETs 54-2 and 56-2, respectively. The gates of FETs 54-1 and 54-2 are coupled to terminal 100. The gates of FETs 56-1 and 56-2 are coupled to terminal 98. FETs 54-1, 54-2, 56-1 and 56-2 thus drive the voltage across capacitor 102 up and down between the $+V_s$ and $-V_s$ supply terminals based upon the switching voltages at the Q and $\overline{Q}$ terminals, pins 4 and 3, respectively, of flip flop 28. Feedback is provided from the source of FET 54-1 and the drain of FET 54-2 through 10K feedback resistors 39', 39' to the + and − input terminals, respectively, of amplifier 10.

The speaker 38 and its associated circuitry 106 are coupled in parallel with the series RC combination 102, 104. The associated circuitry 106 includes a single turn saturable reactor 66 in series with the drain of each of FETs 54-2, 56-2. Reactors 66 are oriented in opposite senses so that, upon any change in current flow in circuit 106, the fields in reactors 66 cancel each other. A nine-turn inductor 34-1, 34-2 is in series between each reactor 66 and a respective terminal of speaker 38. A pair of 0.39 μF capacitors 36-1 and 36-2 in series are coupled across the speaker 38 terminals. A 2.2 μF capacitor 36-3 is coupled in parallel with series capacitors 36-1 and 36-2. The junction of capacitors 36-1 and 36-2 is coupled to the $-V_s$ terminal.

Switching pulses appear across the RC series combination 102, 104 during operation, owing to the recovery of energy stored in the magnetic fields of inductors 34-1 and 34-2. These pulses are coupled through 18 μF, 35 VDC capacitors 114, 116 to a full wave diode bridge rectifier 117 which is coupled through a 20Ω resistor to the switched +V. terminal. Rectifier 117 rectifies these pulses to provide a $+3V_s$ source. They are filtered and stored by a 120 μF, 35 VDC capacitor 118 from which $+3V_s$ is supplied to the driver circuits 88, 90.

Turning to the $K^2(V_s+V_i)(V_s-V_i)$ generator 42, it includes the operational transconductance amplifier 120 of, for example, a ROHM BA6110 integrated circuit 122. The $I_{abc}$ terminal, pin 4, of integrated circuit 122 is coupled through a 10K series resistor to the output terminal of amplifier 80 to receive the $V_i$ signal. $V_i$ is also coupled from the output terminal of amplifier 80 through a 10K series resistor to the + input terminal, pin 1, of integrated circuit 122. $+V_s$ is coupled through a 10K series resistor to the $I_d$ terminal, pin 3, of integrated circuit 122 and through the series combination of two forward biased diodes, illustratively type 1SS133 diodes, and a 10K series resistor to the − input terminal, pin 2, of integrated circuit 122. $+V_s$ is also coupled to pins 7 and 9 of integrated circuit 122. $-V_s$ is coupled to pin 5 of integrated circuit 122. Pin 6, the output terminal of operational transconductance amplifier 120, is coupled through a 15K resistor to the circuit common, through a 220 pF capacitor to $-V_s$ (chassis), through a 300K resistor to $+V_s$, and to the + input terminal of a difference amplifier 124 which is configured as a unity gain buffer amplifier. That is, the output terminal of amplifier 124 is coupled to its − input terminal. The output signal from amplifier 124 is coupled to the − input terminal of amplifier 16. Amplifier 124 illustratively is one fourth of a Motorola type MC34074 quad integrated circuit operational amplifier.

Muting transistors are provided at appropriate locations throughout the circuit of FIG. 4. These include transistor 126, the collector and emitter of which are coupled across capacitor 14, and the base of which is coupled through a 10K resistor to a suitable source of muting signal. The presence of muting signal on the base of transistor 126 shorts the voltage across capacitor 14. The collector of a muting transistor 128 is coupled to the $I_{abc}$ terminal of operational transconductance amplifier 120. The base of transistor 128 is coupled through a 100K resistor to the muting signal source and through a 0.047 μF capacitor to $-V_s$. The emitter of transistor 128 is also coupled to $-V_s$. A muting signal on the base of transistor 128 shorts the $I_{abc}$ signal on pin 4 of the operational transconductance amplifier 120 to $-V_s$. Transistors 126, 128 illustratively are type 2N3904 transistors.

The collector of an additional muting transistor 130 is coupled through a suitable diode, illustratively a type 1SS133, to the drain terminal of FET 92 in each of driver circuits 88, 90. The emitter of transistor 130 is coupled to $-V_s$. The base of transistor 130 is coupled through a 10K resistor to the muting signal source. The muting signal shorts the drive signal for transistors 94, 96 in each of circuits 88, 90 to $-V_s$. Transistor 130 illustratively is a type 2N4401 transistor.

Figure 5:
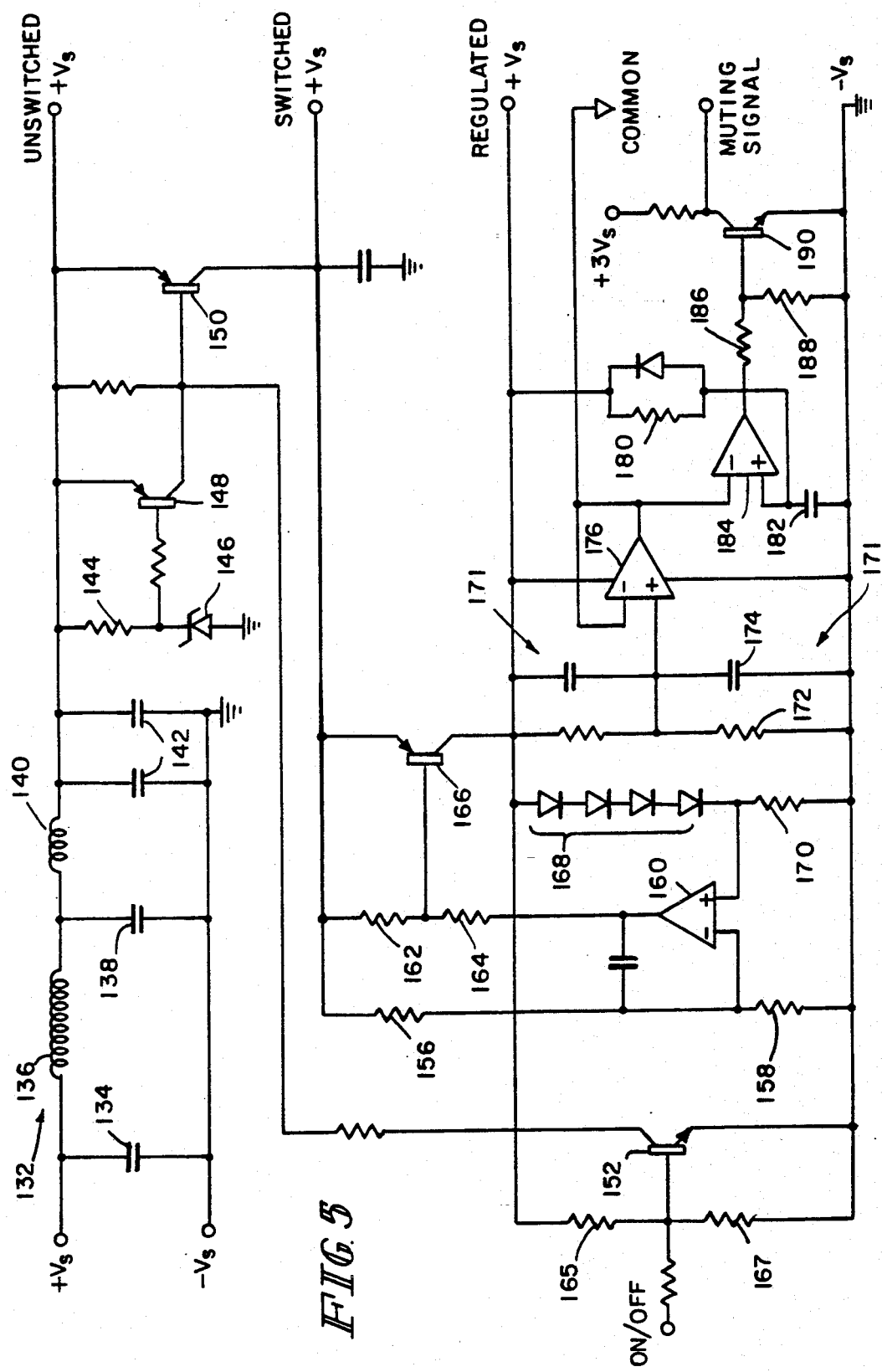

A suitable power supply for the amplifier of FIG. 4 is illustrated in FIG. 5. A multiple section LC filter 132 is coupled across a $2V_s$ source, such as a 12 VDC vehicle battery. The more negative terminal of the source is denominated $-V_s$. Filter 132 includes a 0.047 μF capacitor 134 across the source, a series 100 μH inductor 136 and 1500 μF, 16 VDC capacitor 138 across capacitor 134, and a series 10 μH inductor 140 and 3000 μF, 16 VDC capacitor 142 across capacitor 134. The voltage which appears at the common terminal of inductor 140 and capacitor 142 is denominated $+V_s$. Overvoltage protection is provided by the series combination of a 1K resistor 144 and a zener diode 146 (illustratively a type 1N5246B) across the common terminal of inductor 140 and capacitor 142 and $-V_s$. The junction of resistor 144 and zener diode 146 is coupled through a 1K resistor to the base of a PNP transistor 148. Transistor 148 illustratively is a type 2N3906. The emitter of transistor 148 is coupled to $+V_s$ and its collector is coupled to the base of a PNP transistor 150, illustratively a Motorola type MPS-A56. The emitter of transistor 150 is coupled to $+V_s$. The base of transistor 150 is also coupled to $+V_s$ through a 2K resistor, and to the collector of an NPN transistor 152 through a 2K resistor. The emitter of transistor 152 is coupled to $-V_s$. The base of transistor 152 is coupled through a 10K resistor to an on/off signal source. Transistor 152 illustratively is a Motorola type MPS-A06.

The collector of transistor 150 forms the switched $+V_s$ supply. The collector of transistor 150 is coupled through series 33.2K and 68.1K resistors 156, 158, respectively, to $-V_s$, the amplifier chassis. The common terminal of resistors 156, 158 is coupled to the $-$ input terminal of a difference amplifier 160, the output terminal of which is coupled through a 680 pF capacitor to its $-$ input terminal to provide feedback thereto. Series 1K and 5.1K resistors 162, 164, respectively, couple the collector of transistor 150 to the output terminal of amplifier 160. The emitter of a transistor 166 (illustratively a type 2N4403) is coupled to the collector of transistor 150. The base of transistor 166 is coupled to the common terminal of resistors 162, 164. The collector of transistor 166 is coupled through a series voltage divider including a 120K resistor 165 and a 2.7K resistor 167 to $-V_s$. The junction of resistors 165, 167 is coupled to the base of transistor 152. The collector of transistor 166 is also coupled through four series forward-biased diodes 168 (illustratively, type 1SS133s) and a 5.1K resistor 170 to $-V_s$. The common terminal of diodes 168 and resistor 170 is coupled to the $+$ input terminal of amplifier 160. The collector of transistor 166 forms the regulated $+V_s$ terminal of the supply of FIG. 5. Identical parallel RC networks 171, each including a 10K resistor 172 and a 0.047 $\mu$F capacitor 174, are coupled in series across the regulated $+V_s$ and $-V_{,s}$ terminals. The common terminal of these two RC networks 171 is coupled to the $+$ input terminal of a difference amplifier 176. Networks 171 divide in half the $+V_s$ to $-V_s$ voltage. This voltage is buffered by amplifier 176, which is configured as a unity gain amplifier, to provide at the output terminal of amplifier 176 the signal common for the circuits of FIGS. 4–5.

The muting signals for transistors 126, 128 and 130 of FIG. 4 are developed from the regulated $+V_s$ supply through a series RC time constant circuit including 4.7M resistor 180 and a 0.33 $\mu$F capacitor 182. This series circuit is coupled across the regulated $+V_s$ and $-V_s$ terminals, and the common terminal of resistor 180 and capacitor 182 is coupled to the $+$ input terminal of a difference amplifier 184. Signal common is coupled to the $-$ input terminal of amplifier 184. The output terminal of amplifier 184 is coupled through a series resistive voltage divider including a 10K resistor 186 and a 1K resistor 188 to $-V_s$. The common terminal of resistors 186, 188 is coupled to the base of an NPN transistor 190, which illustratively is a type 2N3904. The emitter of transistor 190 is coupled to $-V_s$. The muting signal is formed on the collector of transistor 190, which is coupled to the $+3V_s$ supply (FIG. 4) through a 5.1K resistor. Amplifiers 160, 176 and 184 illustratively are three fourths of the Motorola type MC34074 quad operational amplifier integrated circuit from which buffer amplifier 124 (FIG. 4) was realized.

What is claimed is:

1. In a push-pull audio amplifier output stage comprising first and second solid state devices, each having a controlled current conducting path comprising first and second terminals and a controlling current conducting path comprising at least a third terminal, and an uncontrolled current conducting path in antiparallel relation with one of said devices' controlled current conducting paths, the improvement comprising a saturable reactor in series with the uncontrolled current conducting path to limit current flow therethrough during the switching of current flow from the controlled current conducting path of one of said devices to the uncontrolled current conducting path occasioned by operation of said amplifier.

2. The apparatus of claim 2 comprising uncontrolled current conducting paths in antiparallel relation with both of said devices' controlled current conducting paths and saturable reactors in series with both of said uncontrolled current conducting paths to limit current flow therethrough during the switching of current flow from both of said controlled current conducting paths to both of said uncontrolled current conducting paths occasioned by operation of said amplifier.

3. The apparatus of claim 2 wherein the devices are first and second field effect transistors (FETs), respectively, the first and second terminals are drain and source terminals of the FETs, the third terminals are gate terminals of the FETs, and the source terminal of the first FET is coupled to the drain terminal of the second FET and to a load of the audio amplifier.

4. The apparatus of claim 3 wherein the uncontrolled current conducting paths comprise first and second diodes, the anodes of which are coupled to the sources of the first and second FETs, respectively, and the cathodes of which are coupled to the drains of the first and second FETs, respectively.

5. The apparatus of claim 4 wherein the first and second diodes are first and second body diodes incorporated into the bodies of the first and second FETs, respectively, during manufacture of the first and second FETs.

6. The apparatus of claim 5 and further comprising an RC circuit in parallel with each of said diodes.

7. The apparatus of claim 6 wherein the audio amplifier is a class D audio amplifier.

8. The apparatus of claim 1 wherein said first device is a field effect transistor (FET), the first and second terminals of said first device are drain and source terminals, respectively of said FET, the third terminal of said first device is the gate terminal of the FET, and one of the source and drain terminals of said FET is coupled to a load of the audio amplifiers.

9. The apparatus of claim 8 wherein the uncontrolled current conducting path in antiparallel relation with said first device's controlled current conducting path comprises a diode, the anode of which is coupled to the source of the FET and the cathode of which is coupled to the drain of the FET.

10. The apparatus of claim 9 wherein the diode is a body diode incorporated into the body of the FET during manufacture of the FET.

11. The apparatus of claim 10 and further comprising an RC circuit in parallel with said diode.

12. The apparatus of claim 11 wherein the audio amplifier is a class D audio amplifier.

13. The apparatus of claim 1 wherein the uncontrolled current conducting path in antiparallel relation with said first device's controlled current conducting path comprises a diode the cathode of which is coupled to the first terminal of said first device and the anode of which is coupled to the second terminal of the first device.

14. The apparatus of claim 13 wherein the diode is incorporated into the body of the first device during manufacture of the first device.

15. The apparatus of claim 14 and further comprising an RC circuit in parallel with the diode.

16. The apparatus of claim 15 wherein the audio amplifier is a class D audio amplifier.

17. The apparatus of claim 1 wherein the uncontrolled current conducting path in antiparallel relation with said one of said devices' controlled current conducting paths is incorporated into said one of said devices during manufacture of said one of said devices.

18. The apparatus of claim 17 and further comprising an RC circuit in parallel with the uncontrolled current conducting path in antiparallel relation with said first device's controlled current conducting path.

19. The apparatus of claim 18 wherein the audio amplifier is a class D audio amplifier.

20. The apparatus of one of claims 1 through 19 wherein the saturable reactor comprises a bead having a passageway therethrough for receiving a conductor which conductor is in series with the uncontrolled current conducting path.

21. In a hysteresis-type pulse width modulator for converting an input voltage into a pulse width modulated waveform, the width of the pulses of which is related to the input voltage amplitude, the modulator comprising a window comparator, a supply voltage source having a pair of terminals across which a supply voltage is provided, and a hysteresis voltage source having a pair of terminals across which a hysteresis voltage is provided, the improvement wherein the hysteresis voltage source comprises a multiplier, means for adding the supply voltage and input voltage to generate a sum voltage, means for subtracting the input voltage from the supply voltage to generate a difference voltage, means for coupling the input voltage to the sum voltage generating means and difference voltage generating means, means for coupling the supply voltage source to the sum voltage generating means and difference voltage generating means, means for coupling the sum voltage generating means and difference voltage generating means to the multiplier, and means for coupling the multiplier to the window comparator.

22. The apparatus of claim 21 wherein the hysteresis-type pulse width modulator comprises an integrator, the window comparator, the hysteresis voltage source, a flip-flop, means for coupling the input voltage to the integrator, means for coupling the integrator to the window comparator, means for coupling the window comparator to the flip-flop, and means for coupling the hysteresis voltage source to the window comparator.

23. The apparatus of claim 22 wherein the window comparator comprises first and second comparators, each having non-inverting and inverting terminals, the means for coupling the integrator to the window comparator comprising means for coupling an output terminal of the integrator to a non-inverting input terminal of the first comparator and to an inverting input terminal of the second comparator, the means for coupling the hysteresis voltage source to the window comparator comprises means for coupling a first of the pair of terminals of the hysteresis voltage source to the inverting input terminal of the first comparator and a second of the pair of terminals of the hysteresis voltage source to the non-inverting input terminal of the second comparator.

* * * * *